(12) United States Patent
Toyoguchi et al.

(10) Patent No.: US 10,504,954 B2
(45) Date of Patent: Dec. 10, 2019

(54) IMAGING DEVICE, IMAGING SYSTEM, AND MOVING BODY

(71) Applicant: CANON KABUSHIKI KAISHA, Tokyo (JP)

(72) Inventors: Ginjiro Toyoguchi, Tokyo (JP); Fumihiro Inui, Yokohama (JP); Hideyuki Ito, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 35 days.

(21) Appl. No.: 15/982,878

(22) Filed: May 17, 2018

(65) Prior Publication Data

US 2018/0342553 A1 Nov. 29, 2018

(30) Foreign Application Priority Data

May 25, 2017 (JP) .................. 2017-103852

(51) Int. Cl.
*H01L 27/146* (2006.01)
*H01L 23/522* (2006.01)
*G06T 7/55* (2017.01)

(52) U.S. Cl.
CPC .......... *H01L 27/14636* (2013.01); *G06T 7/55* (2017.01); *H01L 23/5225* (2013.01); *H01L 27/14612* (2013.01); *H01L 27/14621* (2013.01); *H01L 27/14627* (2013.01); *H01L 27/14645* (2013.01); *G06T 2207/30261* (2013.01)

(58) Field of Classification Search
None
See application file for complete search history.

(56) References Cited

U.S. PATENT DOCUMENTS

| | | | |
|---|---|---|---|
| 2011/0128426 A1 | 6/2011 | Taruki | |
| 2012/0299066 A1* | 11/2012 | Kato | H01L 27/14612 257/222 |
| 2013/0001650 A1* | 1/2013 | Ohtsuki | H01L 27/14603 257/225 |
| 2014/0240631 A1* | 8/2014 | Shishido | G02F 1/136286 349/43 |
| 2015/0194452 A1* | 7/2015 | Watanabe | H01L 27/14603 257/225 |
| 2016/0343763 A1* | 11/2016 | Kagawa | H01L 21/76807 |
| 2017/0125464 A1 | 5/2017 | Abe | |
| 2017/0201702 A1 | 7/2017 | Niwa | |
| 2017/0263669 A1* | 9/2017 | Tamaki | H01L 27/14614 |
| 2019/0035840 A1* | 1/2019 | Kato | H01L 27/14612 |

FOREIGN PATENT DOCUMENTS

| | | |
|---|---|---|
| JP | 2006-50403 A | 2/2006 |
| JP | 2011-114843 A | 6/2011 |
| JP | 2015-185823 A | 10/2015 |
| JP | 2016-12904 A | 1/2016 |

* cited by examiner

*Primary Examiner* — Alexander G Ghyka
(74) *Attorney, Agent, or Firm* — Canon U.S.A., Inc. IP Division

(57) ABSTRACT

An imaging device includes a wiring connected to an output node of an amplification transistor, and the wiring is provided at a position between an output line electrically connected to the output node of the amplification transistor and a gate of the amplification transistor.

19 Claims, 13 Drawing Sheets

IMAGING DEVICE, IMAGING SYSTEM, AND MOVING BODY

BACKGROUND

Field of the Disclosure

The present disclosure relates to an imaging device, an imaging system, and a moving body.

Description of the Related Art

An imaging device has been known which is configured of pixels arranged in a plurality of rows and columns, each of which includes a photoelectric conversion unit, a floating diffusion portion for retaining a signal based on an electric charge of the photoelectric conversion unit, and an amplification unit for outputting a signal based on a potential of the floating diffusion portion to a vertical output line. In order to increase a number of signals per unit time output from the imaging device, an imaging device has been known where a plurality of vertical output lines is arranged with respect to one pixel line, as discussed in Japanese Patent Application Laid-Open No. 2006-50403. According to the above-described imaging device, pixels in a second row output signals to a second vertical output line during a period when pixels in a first row outputs signals to a first vertical output line. With this configuration, a vertical scanning time taken for scanning pixels in a plurality of rows can be shortened.

SUMMARY

According to an aspect of the present invention, an imaging device includes a plurality of pixels each including a photoelectric conversion unit and an amplification transistor having a gate and an output node, the gate being configured to receive a signal from the photoelectric conversion unit, the output node being configured to output a signal based on a potential of the gate, a first output line electrically connected to the output nodes of a first part of the plurality of pixels, a second output line electrically connected to the output nodes of a second part of the plurality of pixels, the second part being different from the first part of the plurality of pixels, a first wiring layer including a wiring connected to the output node, the first wiring layer being provided above an upper side of at least a part of the gate of the amplification transistor of the pixel connected to the first output line, and a second wiring layer including the second output line, the second wiring layer being provided above an upper side of the first wiring layer, wherein at least the part of the gate, the wiring, and the second output line overlap with each other in a planar view.

Further features of the present invention will become apparent from the following description of exemplary embodiments with reference to the attached drawings.

DESCRIPTION OF THE EMBODIMENTS

An input node of an amplification transistor of a second pixel retains an electric charge during a period when an amplification transistor of a first pixel outputs a signal to a first vertical output line. At this time, because of capacitive coupling caused by a parasitic capacitance between the first vertical output line and an input node of the amplification transistor of the second pixel, a signal output from the second pixel is fluctuated. There has been a problem that this causes signal accuracy of the second pixel to be lowered.

The below-described exemplary embodiments relate to a technique of solving the above-described problem.

Hereinafter, each of the exemplary embodiments will be described with reference to the appended drawings.

<Configuration of Imaging Device>

Figure 1:
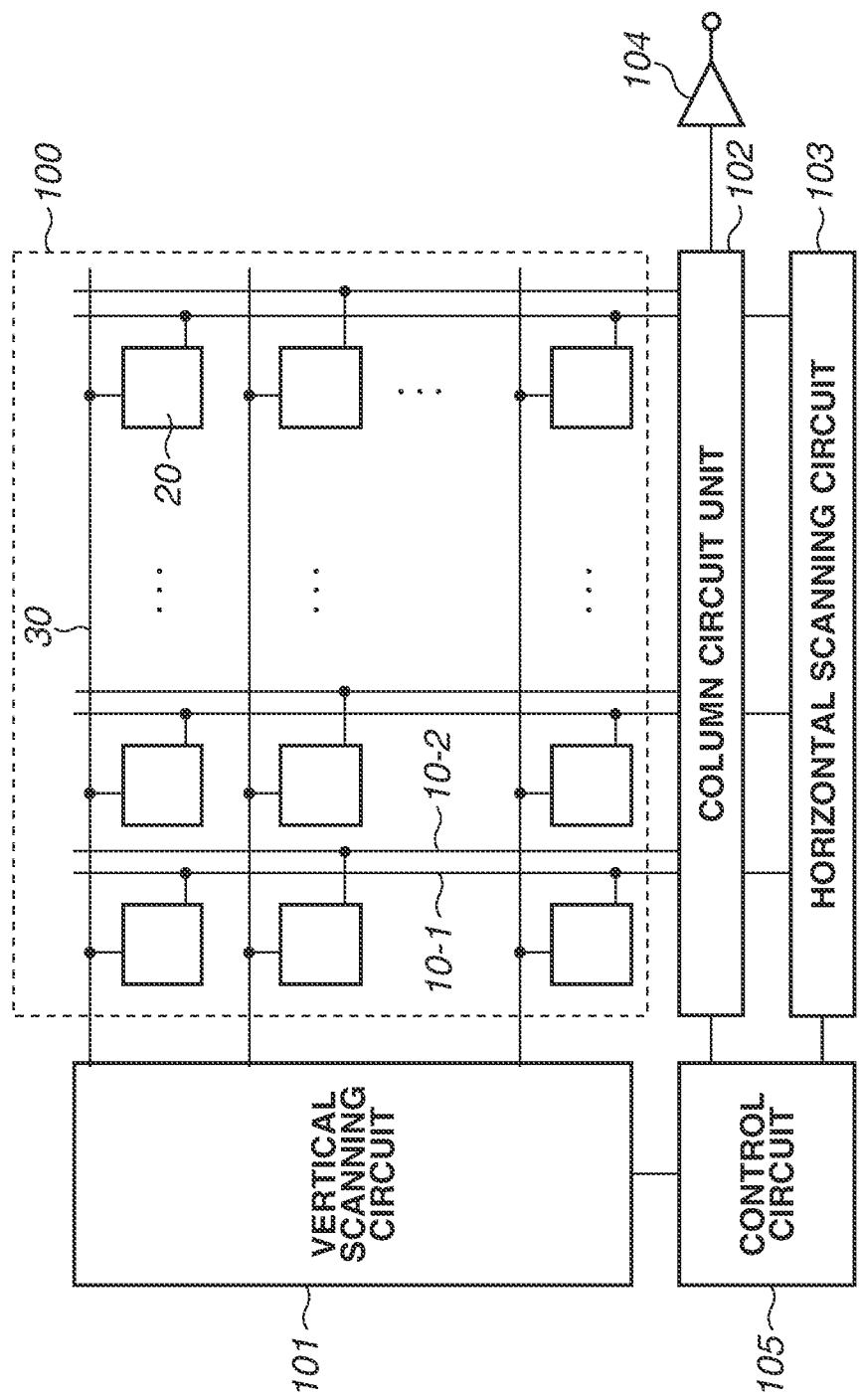
FIG. 1 is a diagram illustrating a configuration of an imaging device.

FIG. 1 is a diagram illustrating a configuration of an imaging device of a first exemplary embodiment. The imaging device of the present exemplary embodiment includes vertical output lines 10-1, 10-2, and pixels 20. In a pixel array 100, the pixels 20 are arranged in a plurality of rows and columns. Each of the vertical output lines 10-1 and 10-2 is arranged with respect to one column where the pixels 20 are arranged. In other words, a plurality of vertical output lines are arranged with respect to one column of pixels 20. The imaging device further includes a vertical scanning circuit 101. One row of pixels 20 arranged across the plurality of columns are connected to the vertical scanning circuit 101 via one control line 30. The vertical scanning circuit 101 controls an accumulation period of the pixels 20.

The imaging device includes a column circuit unit 102, a horizontal scanning circuit 103, and an output circuit 104. The column circuit unit 102 includes a plurality of column circuits. One column circuit of the plurality of column circuits is arranged in correspondence with the vertical output line 10-1, and a different column circuit is arranged in correspondence with the vertical output line 10-2. Each of the column circuits processes a signal output from the pixel 20 to the vertical output line 10-1 or 10-2, and outputs the processed signal to the output circuit 104. The above processing may be analog-to-digital (AD) conversion or amplification.

The horizontal scanning circuit 103 sequentially selects the plurality of column circuits included in the column circuit unit 102. With this processing, respective signals retained by the plurality of column circuits are sequentially output to the output circuit 104. The output circuit 104 outputs the signals to the outside of the imaging device. The signals output from the output circuit 104 are signals output from the imaging device.

The imaging device further includes a control circuit 105. The control circuit 105 is connected to each of the vertical scanning circuit 101, the column circuit unit 102, and the horizontal scanning circuit 103 via driving lines for supplying driving signals.

<Circuit Structure of Pixel>

Figure 2:
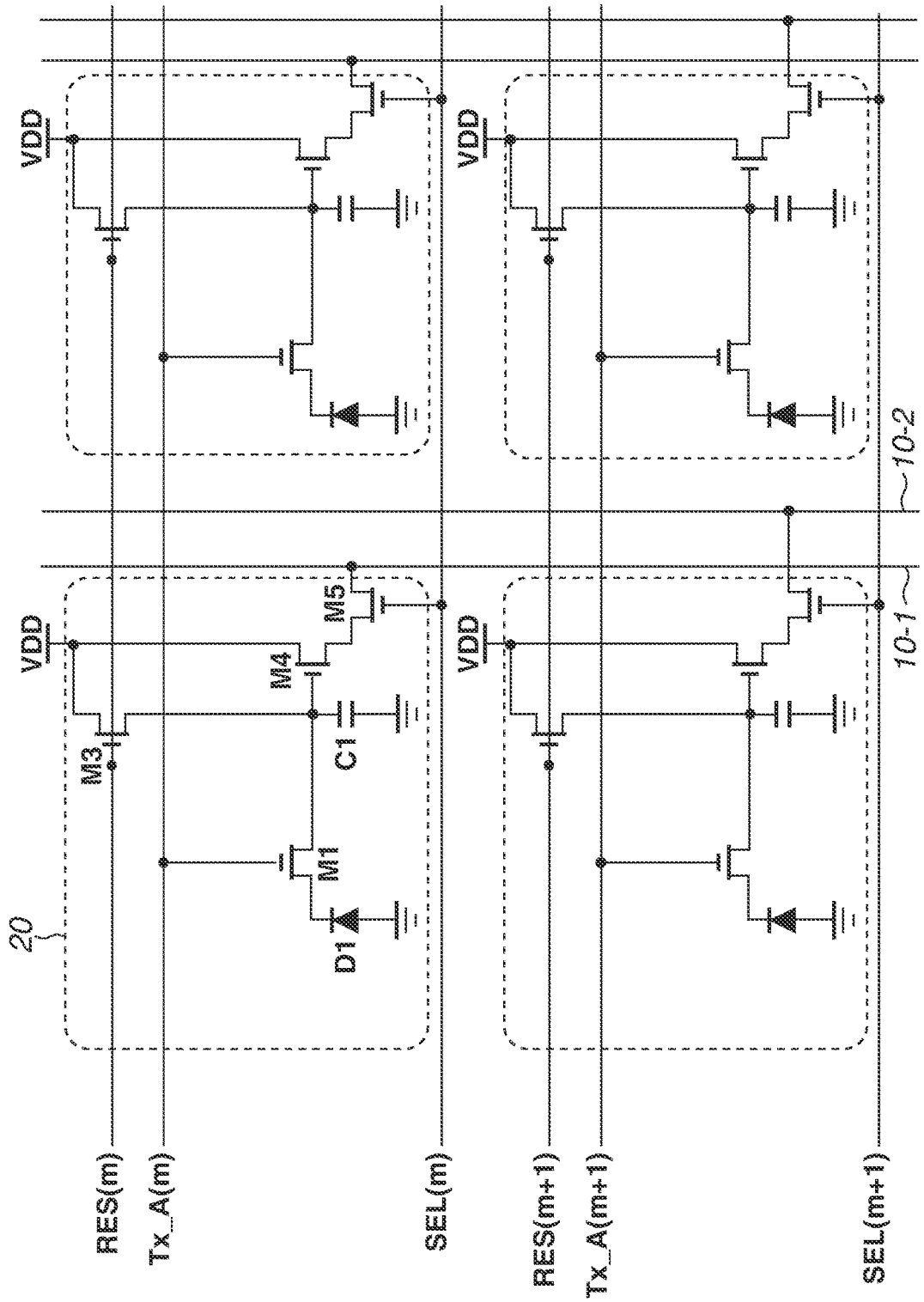
FIG. 2 is an equivalent circuit diagram of a pixel.

FIG. 2 is a diagram illustrating circuits of the pixels 20 arranged in two rows by two columns from among the pixels 20 in FIG. 1. In below-described exemplary embodiments, it is assumed that electric charges to be accumulated by a photodiode serving as a photoelectric conversion unit are electrons. Further, it is assumed that all of transistors included in the pixels 20 are N-type transistors. However, the electric charges to be accumulated by the photodiode may be positive holes. In this case, the transistors included in the pixels 20 may be P-type transistors. In other words, specifications of a conductivity type to be used in the below-described exemplary embodiment can be changed according to the polarity of the electric charge to be treated as a signal.

A pixel 20 includes a photodiode D1 serving as a photoelectric conversion unit, a transfer transistor M1, an electric charge conversion unit C1, a reset transistor M3, an amplification transistor M4, and a selection transistor M5. The transfer transistor M1 is placed on an electric path between a node to which the electric charge conversion unit C1, the reset transistor M3, and the amplification transistor M4 are connected and the photodiode D1. A power source voltage VDD is applied to the reset transistor M3 and the amplification transistor M4. The selection transistor M5 is placed on an electric path between the amplification transistor M4 and the vertical output line 10. In other words, the amplification transistor M4 is electrically connected to the vertical output line 10 via the selection transistor M5. The electric charge conversion unit C1 includes a floating diffusion capacitance provided on the semiconductor substrate and a parasitic capacitance of an electric path extending from the transfer transistor M1 to the amplification transistor M5 via the capacitance portion corresponding to the floating diffusion capacitance.

Each of a signal RES, a signal Tx_A, and a signal SEL is supplied from the vertical scanning circuit 101 via the control line 30 in FIG. 1. In FIG. 2, a symbol representing a pixel row to which the signal is supplied is added to the end of the character representing each signal. For example, a signal RES (m) represents a signal RES supplied to the pixel in the m-th row.

A current source (not illustrated) is connected to each of the vertical output lines 10-1 and 10-2. The selection transistor M5 of the pixel 20 in the m-th row is turned on when the signal SEL (m) turns to an active level. Thereby, electric current is supplied from the current source to the amplification transistor M4 of the pixel 20 in the m-th row. In each of the pixels 20 in the m-th row, a source follower circuit is formed by the power source voltage VDD, the amplification transistor M4, and the current source (not illustrated) connected to the vertical output line 10-1. By forming the source follower circuit, the amplification transistor M4 outputs a signal based on the potential of the electric charge conversion unit C1 to the vertical output line 10-1 via the selection transistor M5.

Further, the selection transistor M5 of the pixel 20 in the m+1-th row is turned on when the signal SEL (m+1) turns to an active level. Thereby, electric current is supplied from the current source to the amplification transistor M4 of the m+1-th row. In each of the pixels 20 in the m+1-th row, a source follower circuit is formed by the power source voltage VDD, the amplification transistor M4, and the current source (not illustrated) connected to the vertical output line 10-2. By forming the source follower circuit, the amplification transistor M4 outputs a signal based on the potential of the electric charge conversion unit C1 to the vertical output line 10-2 via the selection transistor M5.

As described above, the pixels 20 in the m-th row and the pixels 20 in the m+1-th row are respectively connected to different vertical output lines 10.

<Layout of Pixel: Top Plan View>

Figure 3:
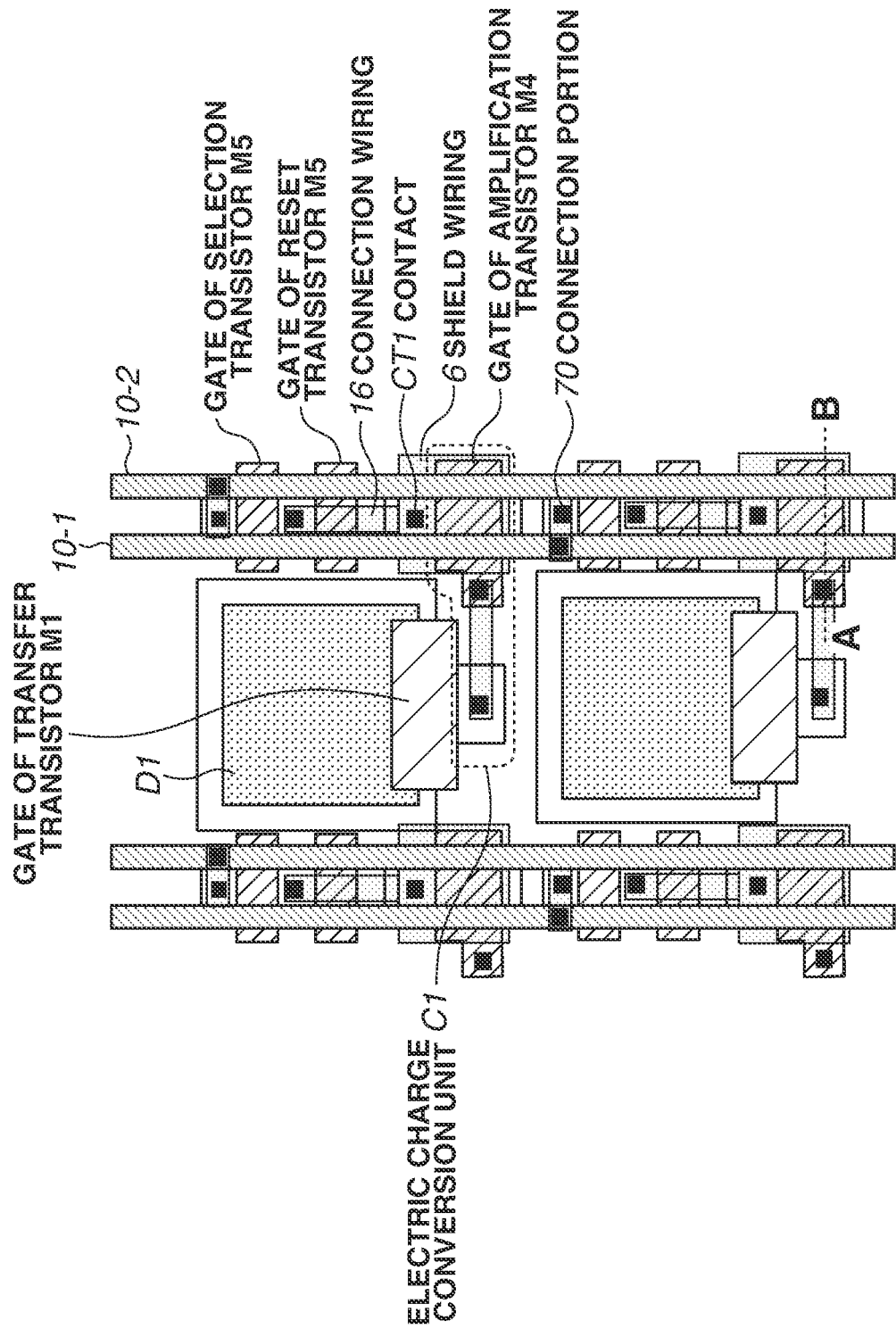
FIG. 3 is a top plan view of the pixel.

FIG. 3 is a diagram illustrating a layout of the pixels 20 and the vertical output lines 10-1 and 10-2 in FIG. 2. A reference numeral the same as that in FIG. 2 is applied to a member having the same function as a member in FIG. 2.

A part of each of the vertical output lines 10-1 and 10-2 is positioned above the upper side of a gate (input node) of the amplification transistor M4. A shield wiring 6 is provided at a position between the gate of the amplification transistor M4 and the vertical output lines 10-1 and 10-2. A connection wiring 16 extending in a direction in which the vertical output line 10 extends is connected to the shield wiring 6. The connection wiring 16 connects the amplification transistor M4 and the selection transistor M5. The shield wiring 6 is connected to a source of the amplification transistor M4 with a contact CT1. Therefore, the potential of the source of the amplification transistor M4 is applied to the shield wiring 6.

At each of the pixels 20 connected to the vertical output line 10-1, at least a part of the gate of the amplification transistor M4, the shield wiring 6, and the vertical output line 10-2 overlap with one another in a planar view.

At each of the pixels 20 connected to the vertical output line 10-2, at least a part of the gate of the amplification transistor M4, the shield wiring 6, and the vertical output line 10-1 overlap with one another in a planar view.

In addition, FIG. 3 illustrates a state where all of the gate of the amplification transistor M4, the shield wiring 6, and the vertical output lines 10-1 and 10-2 overlap at each of the pixels 20 connected to the vertical output line 10-1 and the pixels 20 connected to the vertical output line 10-2.

<Layout of Pixel: Cross-Sectional View>

Figure 4:
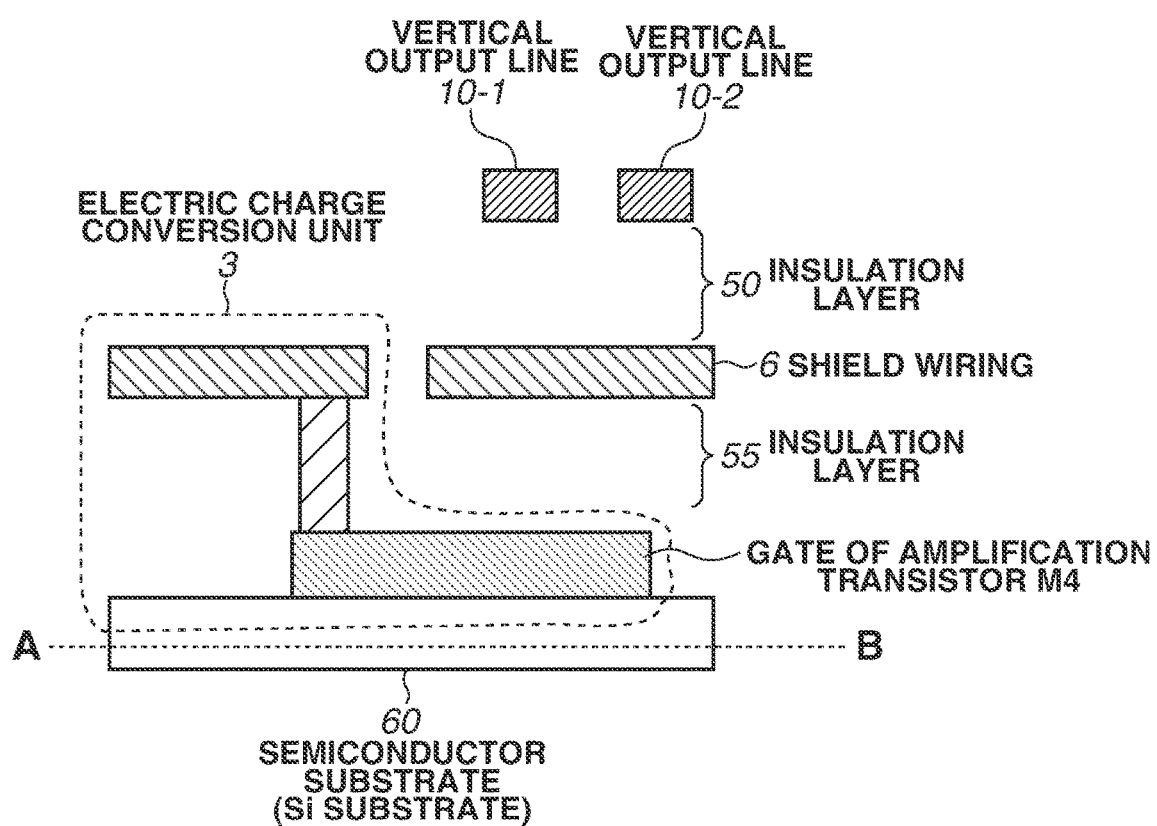
FIG. 4 is a cross-sectional view of the pixel.

FIG. 4 is a diagram illustrating a cross-sectional view of an area through which a line A-B in FIG. 3 passes. A gate of the amplification transistor M4 is provided on a surface of a semiconductor substrate 60. Further, the shield wiring 6 is provided at a position between the gate of the amplification transistor M4 and the vertical output lines 10-1 and 10-2. The shield wiring 6 is provided in a wiring layer at a height that is the same as a height of the wiring layer of the electric charge conversion unit 3.

An insulation layer 55 is provided at a position between the shield wiring 6 and the gate of the amplification transistor M4. The shield wiring 6 is provided in a first wiring layer positioned above the upper side of at least a part of the gate of the amplification transistor M4.

As illustrated in FIG. 3, the selection transistor M5 of the pixel 20 having the amplification transistor M4 through which the line A-B in FIG. 3 passes is connected to the vertical output line 10-1 (first output line) via a connection portion 70. The shield wiring 6 is provided in the first wiring layer separated by the insulation layer 55 and positioned between the vertical output line 10-2 (second output line) different from the first vertical output line 10-1 and the gate of the amplification transistor M4. The shield wiring 6 is positioned above the upper side of the gate of the amplification transistor M4. The shield wiring 6 is connected to a source as an output node of the amplification transistor M4. In other words, the shield wiring 6 is arranged above the upper side of the input node of the amplification transistor M4, and the output node of the amplification transistor M4 is connected thereto.

The vertical output lines 10-1 and 10-2 are provided in a second wiring layer separated from the shield wiring 6 by an insulation layer 50. In other words, the shield wiring 6 is separated from the vertical output lines 10-1 and 10-2 by the insulation layer 50.

<Effect of Shield Wiring>

There is a case where the amplification transistor M4 of one pixel 20 outputs a signal to the vertical output line 10-2 during a period when the amplification transistor M4 of another pixel 20 connected to the vertical output line 10-1 via the connection portion 70 in FIG. 3 outputs a signal to the vertical output line 10-1. If the shield wiring 6 is not provided, capacitive coupling caused by a parasitic capacitance between the vertical output line 10-2 and the gate of the amplification transistor M4 of the pixel 20 connected to the vertical output line 10-1 will be increased. Because of the capacitive coupling, a potential of the electric charge conversion unit 3 of the pixel 20 connected to the vertical output lint 10-1 is fluctuated. In other words, a signal output from the first pixel is mixed to a signal output from the second pixel. Because of this mixing of signals, signal accuracy of the signal output from the second pixel is lowered. Similarly, a signal output from the second pixel is also mixed to a signal output from the first pixel. Therefore, signal accuracy of the signal output from the first pixel is also lowered.

This mixing of signals appears as color mixture if color filters arranged on the pixels 20 have different colors.

Figure 5:
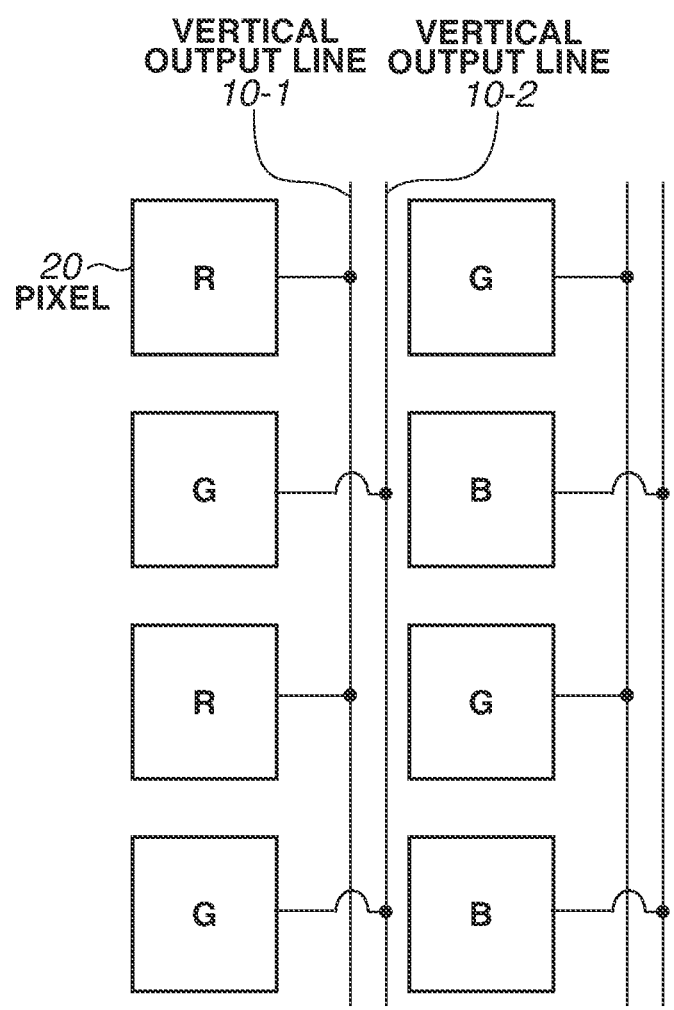
FIG. 5 is a diagram illustrating arrangement of a color filter of the pixel.

FIG. 5 is a diagram illustrating arrangement of color filters of the imaging device of the present exemplary embodiment. Symbols "R", "G", and "B" in FIG. 5 represent color filters of respective colors of red, green, and blue.

A pixel 20 in the first column from the left in FIG. 2 connected to the vertical output line 10-1 has a red color filter. A pixel 20 in the first column connected to the vertical output line 10-2 has a green color filter. The pixel 20 having the green color filter outputs a signal to the vertical output line 10-2 during a period when the pixel 20 having the red color filter outputs a signal to the vertical output line 10-1. Therefore, if the shield wiring 6 is not provided, the signal output from the pixel 20 having the red color filter and the signal output from the pixel 20 having the green color filter mixed to each other to cause color mixture.

On the other hand, the imaging device of the present exemplary embodiment includes the shield wiring 6. With this configuration, at the pixel 20 that outputs a signal to the vertical output line 10-1, the parasitic capacitance between the gate of the amplification transistor M4 and the vertical output line 10-2 can be reduced in comparison to the case where the shield wiring 6 is not provided. Therefore, capacitive coupling between the gate of the amplification transistor M4 and the vertical output line 10-2 is reduced because the shield wiring 6 is provided, so that a signal from another pixel 20 is less likely to be mixed.

Further, in the imaging device of the present exemplary embodiment, the shield wiring 6 is connected to the output node of the amplification transistor M4. For example, if a predetermined power voltage is to be supplied to the shield wiring 6, a wiring for supplying the predetermined power voltage to the shield wiring 6 has to be provided. This increase in the number of wirings may cause a disadvantage such as a decrease in an aperture area of the photodiode D1, a decrease in a degree of freedom of the wiring layout or the element layout, or an increase in cost caused by an increase in the number of manufacturing processing steps.

On the other hand, in the imaging device of the present exemplary embodiment, an output of the output node of the amplification transistor M4 serves as a potential supplied to the shield wiring 6. With this configuration, capacitive coupling between the vertical output line 10-2 and the gate of the amplification transistor M4 can be favorably reduced without increasing the wiring for supplying a potential to the shield wiring 6.

<Variation 1 of First Exemplary Embodiment>

In the present exemplary embodiment, a configuration in which the pixel 20 includes the selection transistor M5 on the electric path between the amplification transistor M4 and the vertical output line 10 has been described as an example. A configuration may be given as another example where the output node (source) of the amplification transistor M4 is connected to the vertical output line 10 while the pixel 20 does not have the selection transistor M5. In this case, a pixel 20 for outputting a signal to the vertical output line 10 may be selected by changing a reset potential of the electric charge conversion unit 3. Specifically, the potential of any one of the VDD1 and the VDD2 can be selectively supplied to a drain of the reset transistor M3. With respect to a pixel 20, which is not selected (i.e., a pixel 20 which does not output a signal to the vertical output line 10), the potential to be supplied to the drain of the reset transistor M3 is the VDD1. Then, the potential of the VDD1 is input to the electric charge conversion unit 3 when the reset transistor M3 is turned on. This potential VDD1 makes the voltage between the gate and the source of the amplification transistor M4 be a threshold value or less. Therefore, the amplification transistor M4 is brought into an OFF state.

On the other hand, with respect to a pixel 20, which is selected (i.e., a pixel 20 which outputs a signal to the vertical output line 10), the potential to be supplied to the drain of the reset transistor M3 is the potential VDD2. Then, the potential of the VDD2 is input to the electric charge conversion unit 3 when the reset transistor M3 is turned on. The potential VDD2 makes the voltage between the gate and the source of the amplification transistor M4 be a threshold value or more. Therefore, the amplification transistor M4 is brought into an ON state, and outputs the signal to the vertical output line 10.

In this case, an effect described in the first exemplary embodiment can be also acquired by connecting the output node of the amplification transistor M4 to the shield wiring 6.

<Variation 2 of First Exemplary Embodiment>

Figure 6:
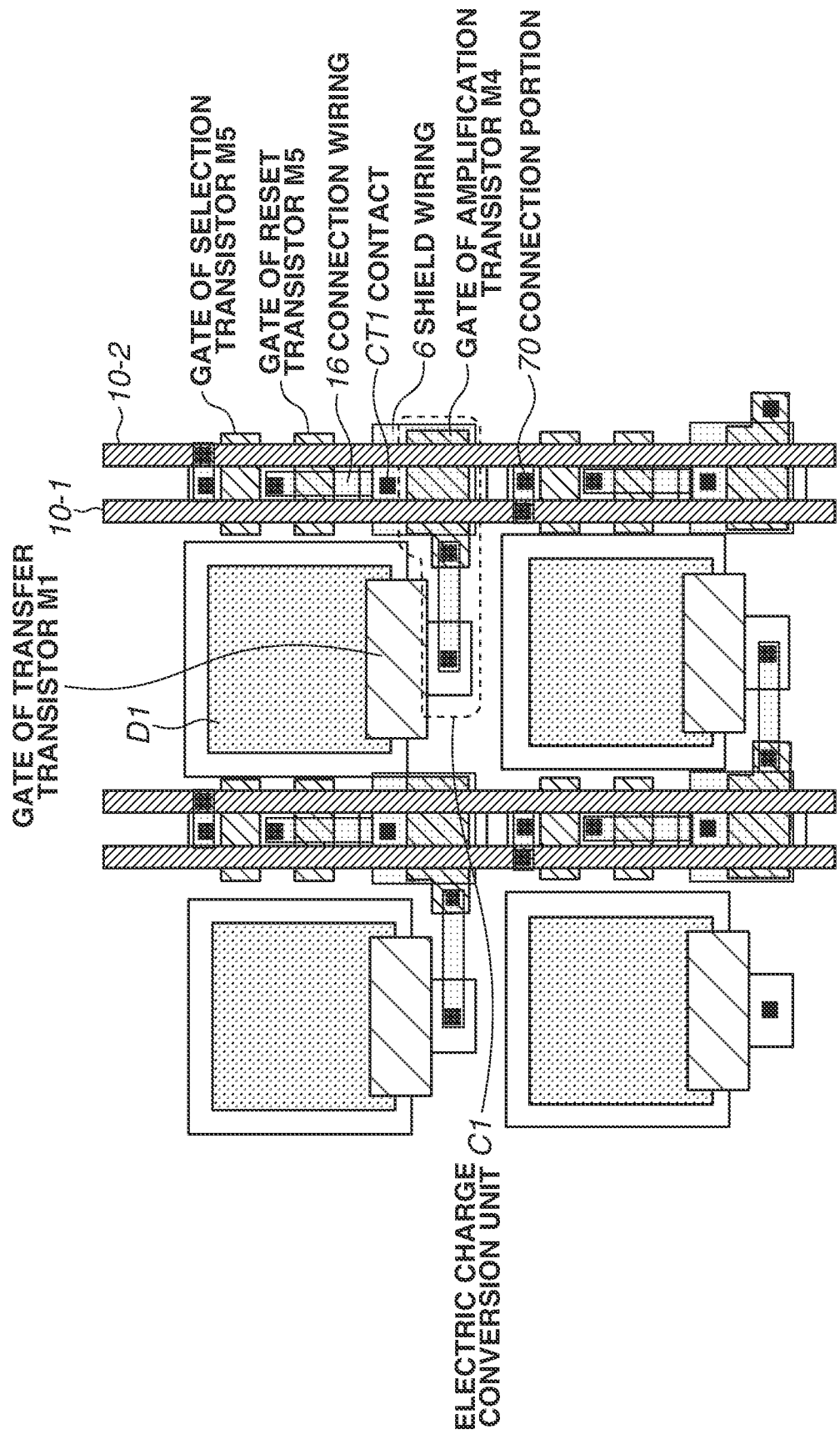
FIG. 6 is a top plan view of the pixel.

In the first exemplary embodiment, a configuration in which a plurality of vertical output lines 10 is provided with respect to one column of pixels 20 has been described as an example. As illustrated in FIG. 6, a column of pixels connected to the vertical output line 10-1 and a column of pixels connected to the vertical output line 10-2 may be different from each other. In the example illustrated in FIG. 6, the pixels 20 in the second row can output signals during a period when the pixels 20 in the first row output signals. In this case, an effect similar to the effect described in the first exemplary embodiment can be acquired by providing the shield wiring 6.

<Variation 3 of First Exemplary Embodiment>

In the first exemplary embodiment, the shield wiring 6 is formed over the entire plane above the upper side of the gate of the amplification transistor M4. However, the configuration is not limited to the above, and the shield wiring 6 may be formed above the upper side of at least a part of the gate of the amplification transistor M4.

A configuration different from the configuration described in the first exemplary embodiment will be mainly described with respect to an imaging device of a second exemplary embodiment.

Figure 7:
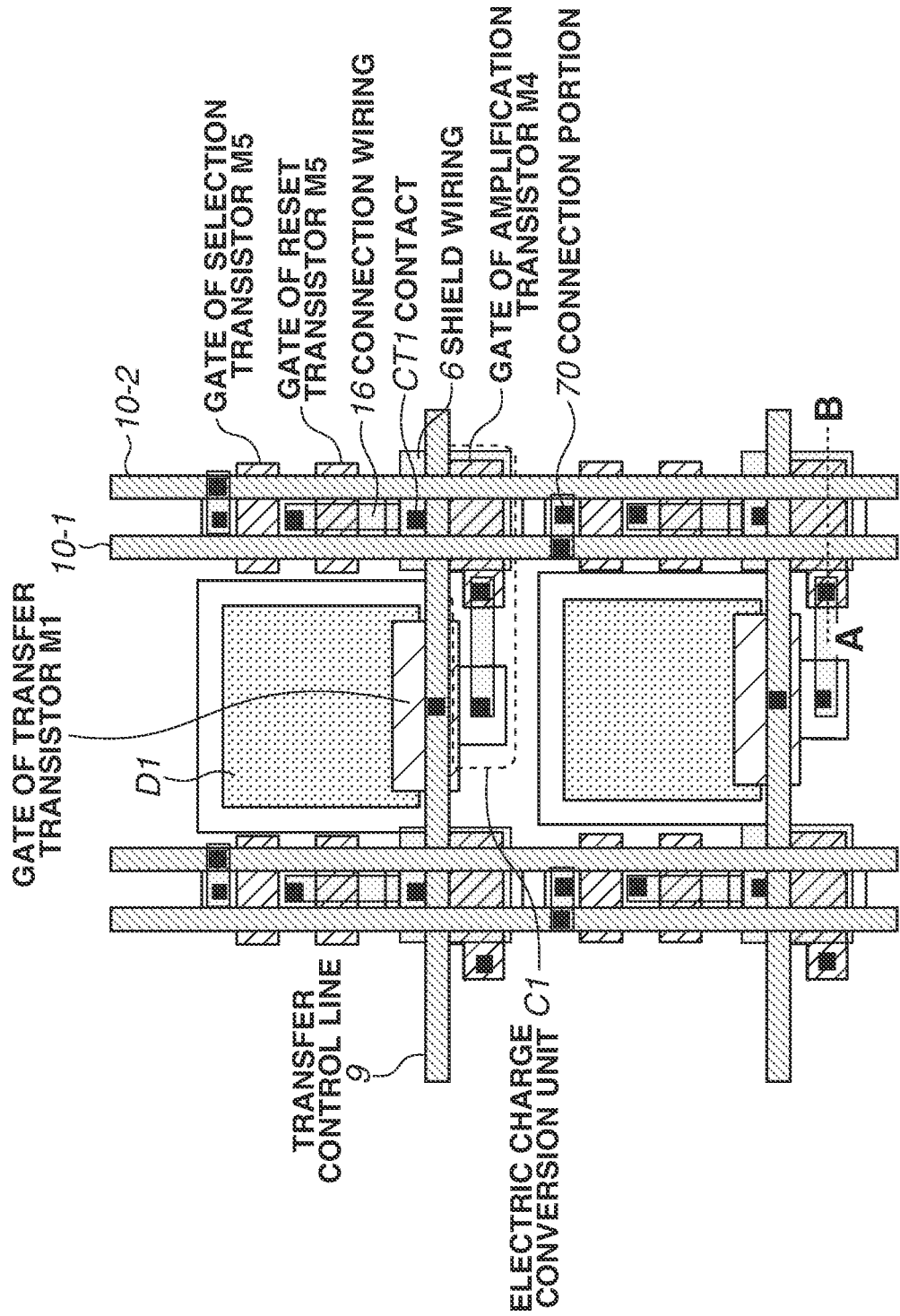
FIG. 7 is a top plan view of the pixel.

FIG. 7 is a diagram illustrating a top plan view of a pixel 20 of the imaging device of the present exemplary embodiment.

The present exemplary embodiment is different from the first exemplary embodiment in that a transfer control line 9 is placed at a position between the vertical output line 10 and the shield wiring 6. More specifically, the shield wiring 6 is provided at a position between the transfer control line 9 and the gate of the amplification transistor M4.

The transfer control line 9 is connected to a gate of the transfer transistor M1 via a contact. The transfer control line 9 transfers a signal Tx_A illustrated in FIG. 2.

In the present exemplary embodiment, the shield wiring 6 is provided at a position between the transfer control line 9 and the gate of the amplification transistor M4. With this configuration, capacitive coupling between the transfer control line 9 and the gate of the amplification transistor M4 is reduced. Therefore, fluctuation of the potential of the electric charge conversion unit 3 caused by the signal Tx_A transmitted by the transfer control line 9 is reduced.

As described above, the imaging device of the present exemplary embodiment includes the shield wiring 6 provided at a position between the transfer control line 9 and the gate of the amplification transistor M4. With this configuration, an effect of reducing the fluctuation of the potential of the electric charge conversion unit 3 caused by the signal Tx_A transmitted by the transfer control line 9 can be acquired.

In the present exemplary embodiment, although a configuration in which the shield wiring 6 shields the gate of the amplification transistor M4 from the transfer control line 9 is described as an example, the exemplary embodiment is not limited thereto. For example, the shield wiring 6 may shield the gate of the amplification transistor M4 from a control line that transmits a reset signal to the reset transistor M3, or from a control line that transmits a selection signal to the selection transistor M5.

In other words, in the imaging device of the present exemplary embodiment, the shield wiring 6 may be formed at a position between a control line which transmits a signal for controlling a transistor (at least any one of a reset transistor, a transfer transistor, and a selection transistor) connected to the amplification transistor M4 and the gate of the amplification transistor M4.

A configuration different from the configuration described in the first exemplary embodiment will be mainly described with respect to an imaging device of a third exemplary embodiment. The imaging device of the present exemplary embodiment includes a pixel 200 in place of the pixel 20 illustrated in FIG. 1.

Figure 8:
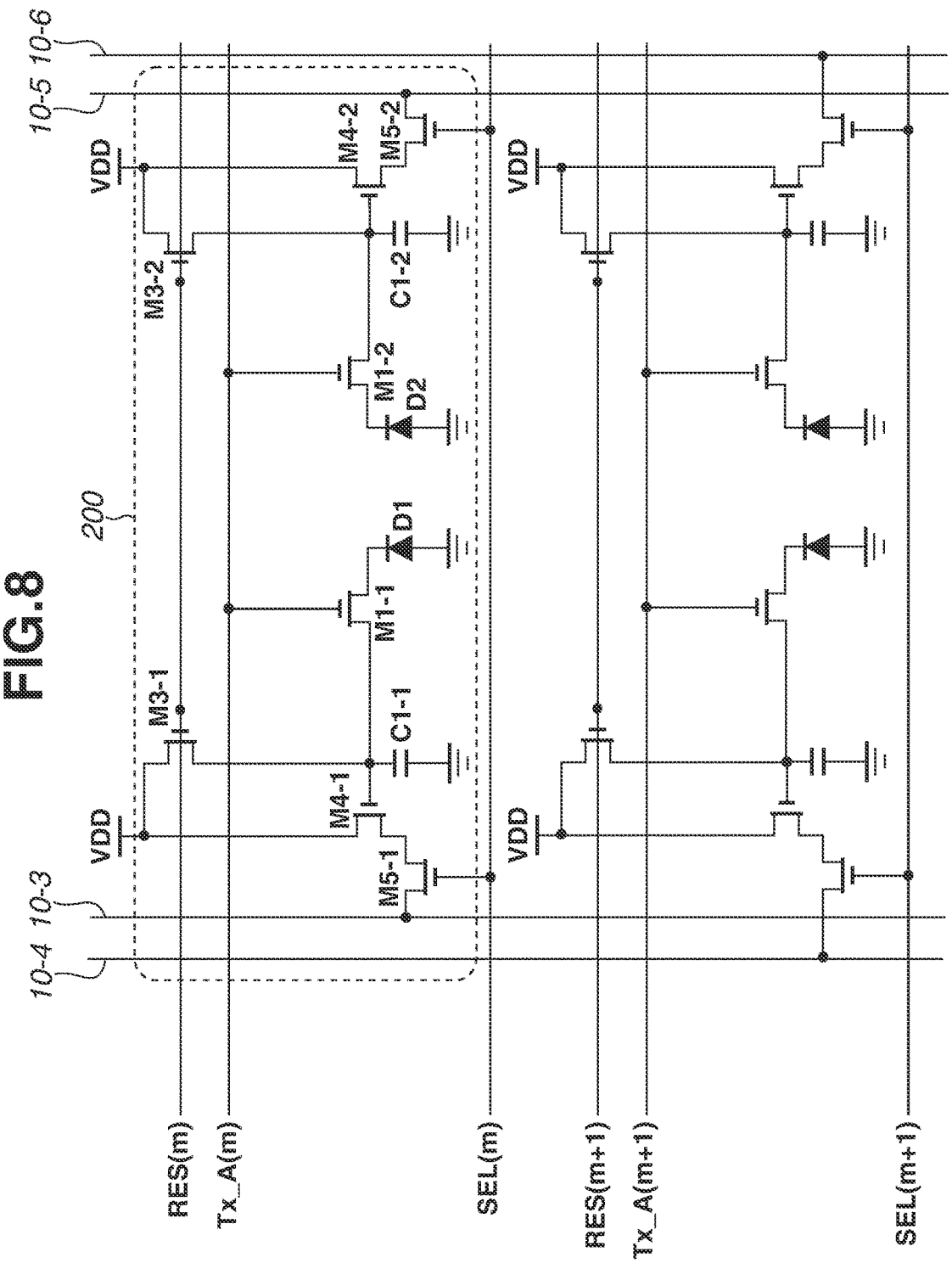
FIG. 8 is an equivalent circuit diagram of the pixel.

FIG. 8 is a circuit diagram illustrating an equivalent circuit of the pixel 200 of the present exemplary embodiment.

Each of the pixels 200 of the present exemplary embodiment includes a plurality of photodiodes D1 and D2. Light that has passed through one microlens (not illustrated) enters both of the photodiodes D1 and D2. A signal processing unit (not illustrated) that processes a signal of the imaging device can execute focus detection through a phase difference detection method by using signals accumulated by the photodiodes D1 and D2.

Further, the pixel 200 includes a transfer transistor M1-1, a floating diffusion capacitance portion C1-1, a reset transistor M3-1, an amplification transistor M4-1, and a selection transistor M5-1. The pixel 200 further includes a transfer transistor M1-2, a floating diffusion capacitance portion C1-2, a reset transistor M3-2, an amplification transistor M4-2, and a selection transistor M5-2. A structure of the pixel 200 in the m+1-th row is similar to that of the pixel 200 in the m-th row, so that a reference numeral thereof is omitted.

The selection transistor M5-1 of the pixel 200 in the m-th row is connected to a vertical output line 10-3. Further, the selection transistor M5-1 of the pixel 200 in the m+1-th row is connected to a vertical output line 10-4.

The selection transistor M5-2 of the pixel 200 in the m-th row is connected to a vertical output line 10-5. Further, the selection transistor M5-2 of the pixel 200 in the m+1-th row is connected to a vertical output line 10-6.

A common signal Tx_A(m) is input to the respective gates of the transfer transistors M1-1 and M1-2 in the m-th row.

A common signal RES (m) is input to the respective gates of the reset transistors M3-1 and M3-2 in the m-th row.

A common signal SEL (m) is input to the respective gates of the selection transistors M5-1 and M5-2 in the m-th row.

Figure 9:
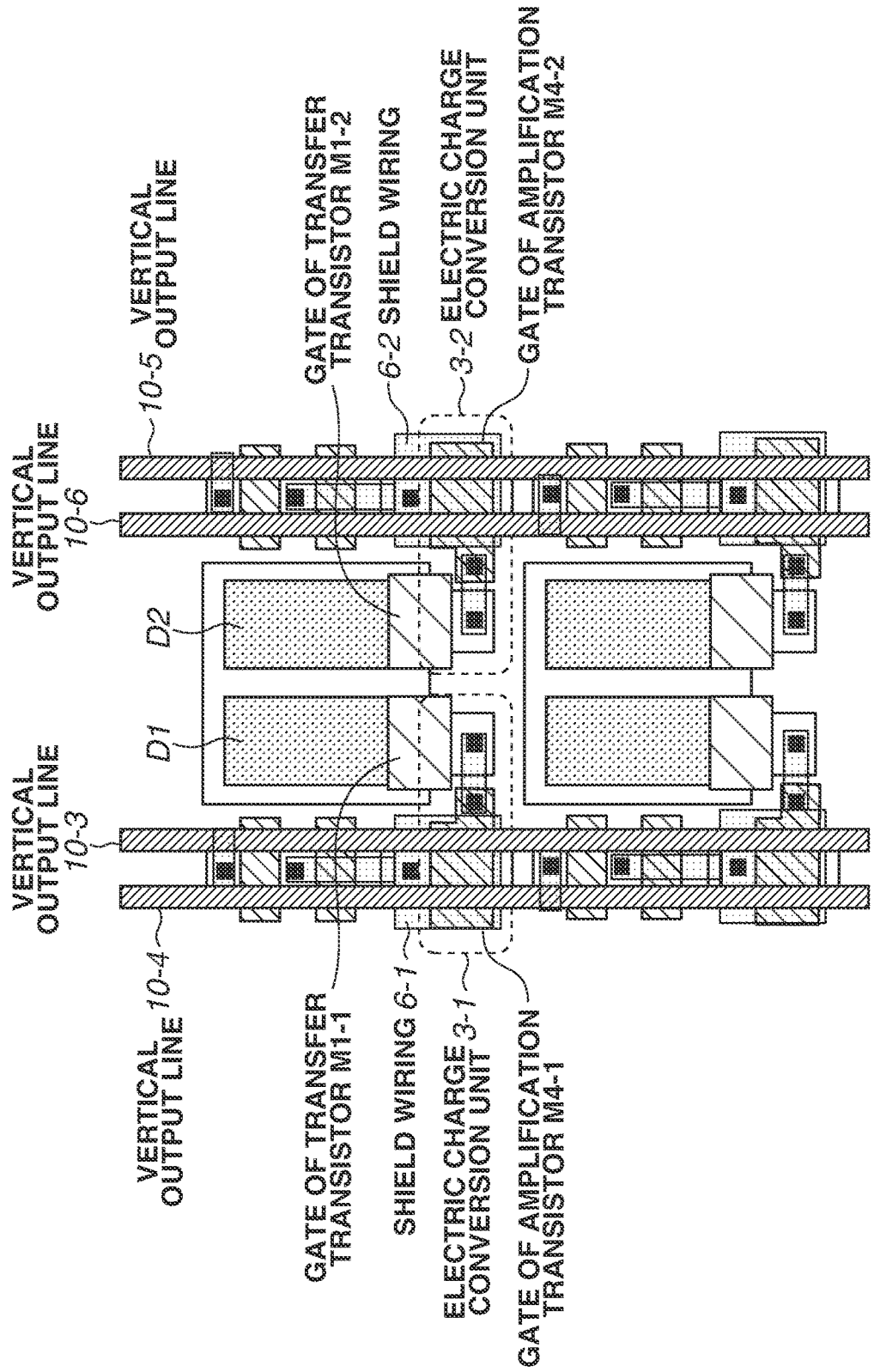
FIG. 9 is a top plan view of the pixel.

FIG. 9 illustrates a top plan view of a layout of the pixels 20 in FIG. 8.

A reference numeral that is the same as that in FIG. 8 is also allocated to a member in FIG. 9 having a function that is the same as that of a member in FIG. 8.

An electric charge conversion unit 3-1 includes the floating diffusion capacitance portion C1-1, a gate of the amplification transistor M4-1, and a wiring that connects the gate and the floating diffusion capacitance portion C1-1 in FIG. 8.

An electric charge conversion unit 3-2 includes the floating diffusion capacitance portion C1-2, a gate of the amplification transistor M4-2, and a wiring that connects the gate and the floating diffusion capacitance portion C1-2 in FIG. 8.

In the present exemplary embodiment, in the pixel 200 having the selection transistor M5-1 connected to the vertical output line 10-3, a shield wiring 6-1 is provided at a position between the vertical output line 10-4 and the gate of the amplification transistor M4-1. Further, in the pixel 200 having the selection transistor M5-2 connected to the vertical output line 10-5, a shield wiring 6-2 is provided at a position between the vertical output line 10-6 and the gate of the amplification transistor M4-2.

In the imaging device of the present exemplary embodiment, similar to the first exemplary embodiment, mixing of signals output from respective pixels can be reduced through the above-described configuration.

In addition, the present exemplary embodiment can be combined with the second exemplary embodiment. Specifically, the shield wiring 6 may shield the gate of the amplification transistor M4 from a wiring such as a transfer control line, which transmits a signal to the gate of the transistor of the pixel 200.

A configuration different from the configuration described in the third exemplary embodiment will be mainly described with respect to an imaging device of a fourth exemplary embodiment.

The imaging device of the third exemplary embodiment is a front-face illumination type imaging device where light passing through a microlens enters the photodiodes D1 and D2 via a wiring layer. In other words, the wiring layer is formed at a position between the microlens and the photodiodes D1 and D2. On the other hand, the imaging device of the present exemplary embodiment is a so-called back-face illumination type imaging device where the photodiodes D1 and D2 are formed at a position between the microlens and the wiring layer.

The equivalent circuit of the pixel of the present exemplary embodiment is the same as the circuit in FIG. 8.

Figure 10:
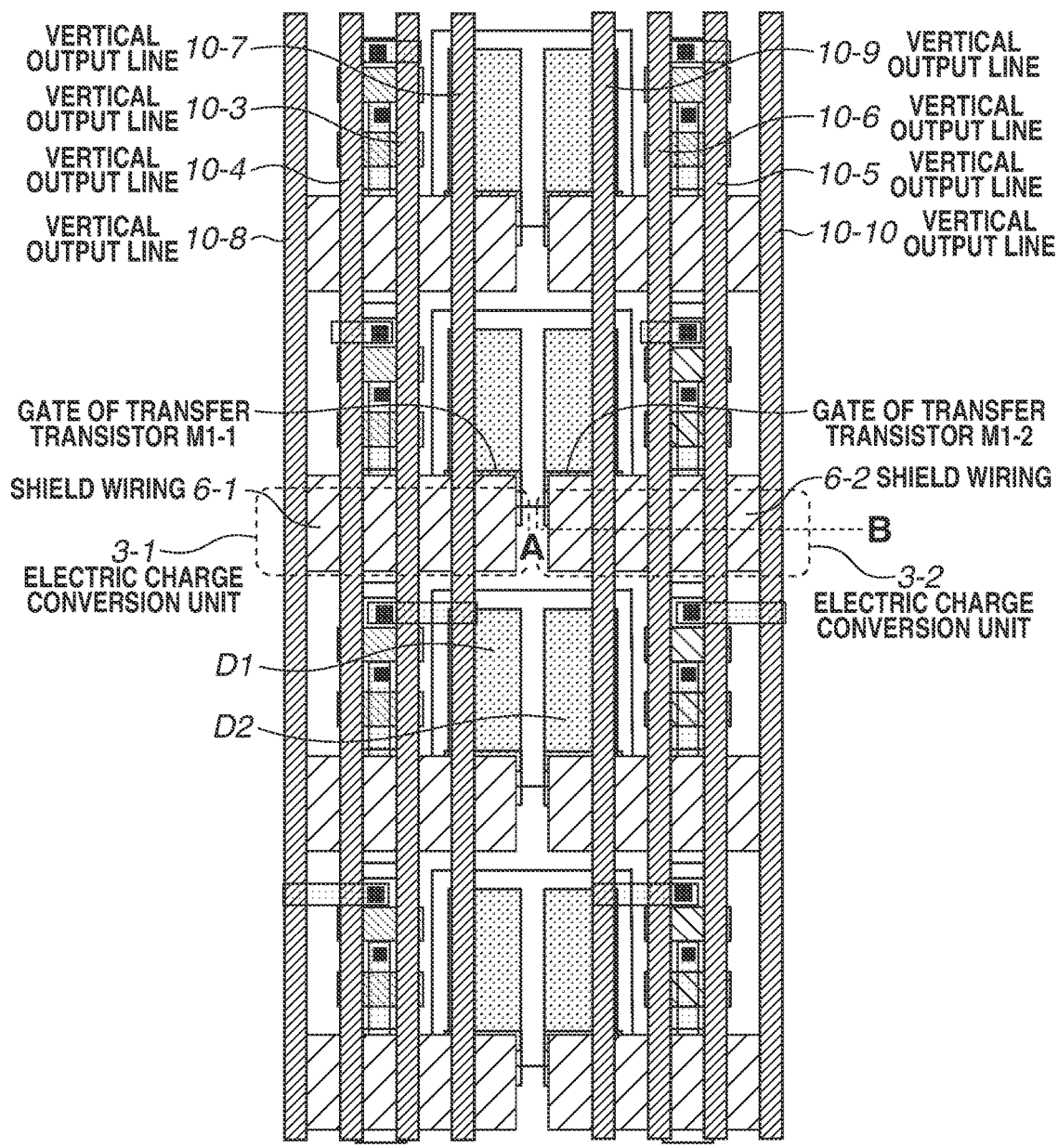
FIG. 10 is a top plan view of the pixel.

FIG. 10 illustrates a top plan view of a layout of the pixels 200 of the present exemplary embodiment. FIG. 10 is a diagram illustrating a semiconductor substrate on which a photodiode is formed, which is viewed from a side of the wiring layer.

A reference numeral that is the same as that in FIG. 9 is also allocated to a member in FIG. 10 having a function that is the same as that of a member in FIG. 9.

In the present exemplary embodiment, eight vertical output lines 10-3 to 10-10 are provided for one column of pixels 200.

Figure 11:
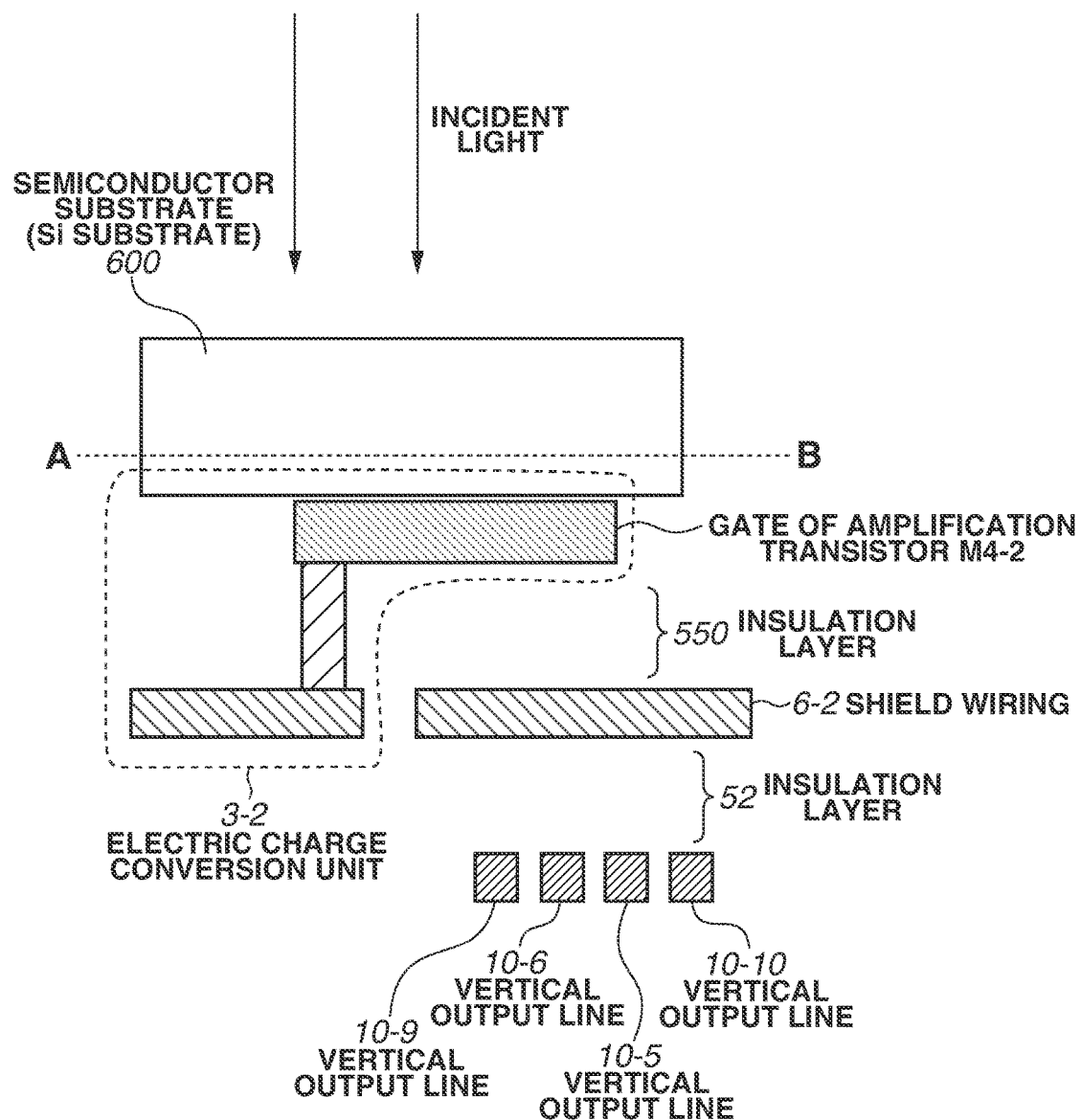
FIG. 11 is a cross-sectional view of the pixel.

FIG. 11 illustrates a cross-sectional view of an area through which a line A-B in FIG. 10 passes.

Incident light enters from an upper face as a first face of a semiconductor substrate 600. Then, a gate of the amplification transistor M4-2 is formed on a second face on the opposite side of the first face of the semiconductor substrate 600.

Further, a shield wiring 6-2 is provided at a position between the vertical output lines 10-5 to 10-10 and the gate of the amplification transistor M4-2. An insulation layer 52 is formed at a position between the shield wiring 6-2 and the vertical output lines 10-5 to 10-10. An insulation layer 550 is formed at a position between the shield wiring 6-2 and the gate of the amplification transistor M4-2.

With this configuration, in the back-face illumination type imaging device of the present exemplary embodiment, an effect similar to that of the first exemplary embodiment can be acquired.

In addition, the present exemplary embodiment can be also combined with another exemplary embodiment. For example, the present exemplary embodiment can be combined with the second exemplary embodiment. Specifically, the shield wiring 6 may shield the gate of the amplification transistor M4 from the wiring such as the transfer control line, which transfers a signal to the gate of the transistor of the pixel 200.

Figure 12:
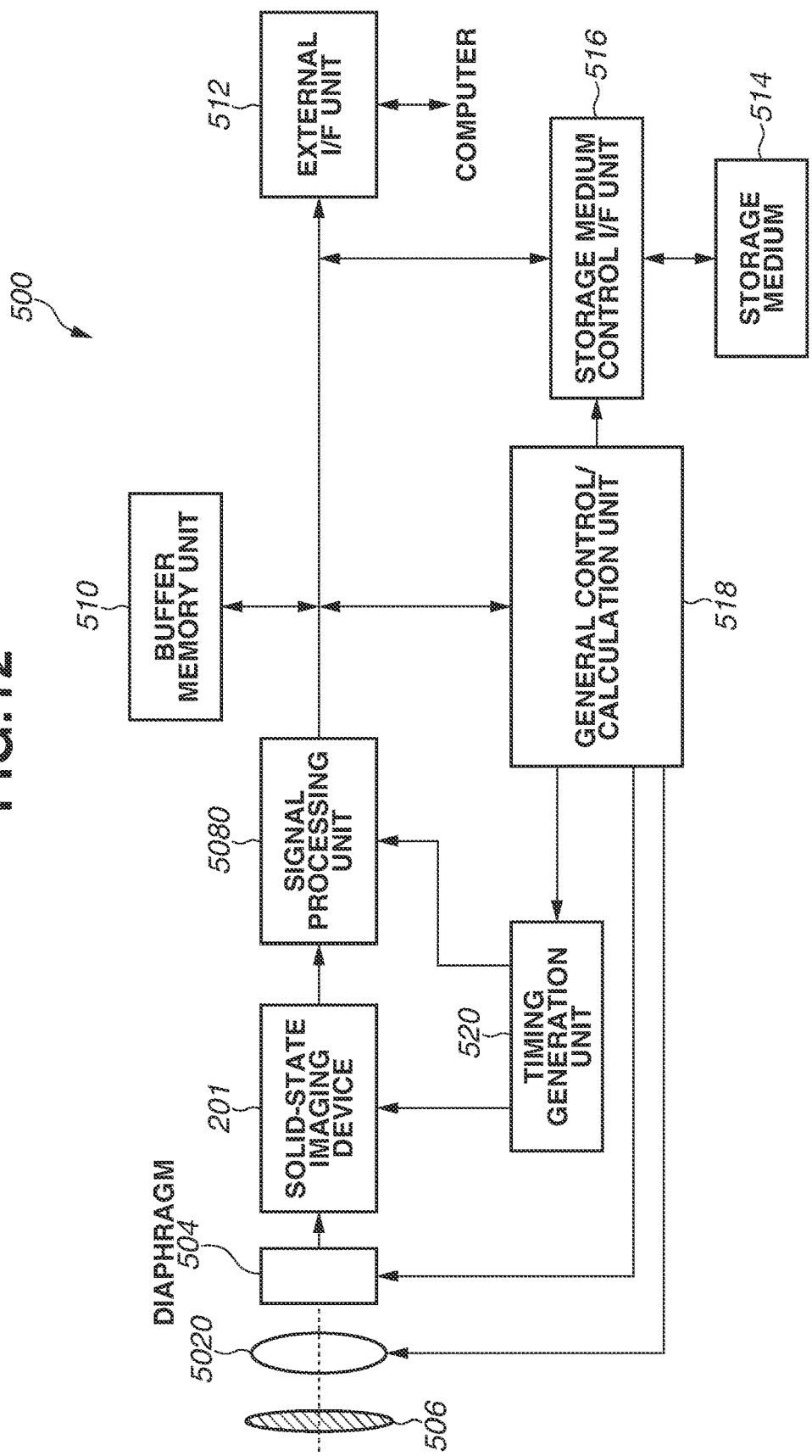
FIG. 12 is a diagram illustrating a configuration of an imaging system.

FIG. 12 is a block diagram illustrating a configuration of an imaging system 500 of a fifth exemplary embodiment. The imaging system 500 of the present exemplary embodiment includes a solid-state imaging device 201 for which any one of the configurations of the imaging devices described in the respective exemplary embodiments is used. A digital still camera, a digital camcorder, and a monitoring camera are given as specific examples of the imaging system 500. FIG. 12 is a block diagram illustrating a configuration example of a digital still camera for which any one of the imaging devices of the above-described exemplary embodiments is used as the solid-state imaging device 201.

The imaging system 500 in FIG. 12 includes the solid-state imaging device 201, a lens 5020 that forms an optical image of an object on the solid-state imaging device 201, a diaphragm 504 that makes an amount of light passing through the lens 5020 become changeable, and a barrier 506 for protecting the lens 5020. The lens 5020 and the diaphragm 504 serve as an optical system that condenses light into the solid-state imaging device 201.

The imaging system 500 further includes a signal processing unit 5080 for processing a signal output from the solid-state imaging device 201. The signal processing unit 5080 executes signal processing of executing various kinds of correction or compression on an input signal as necessary and outputting the signal. The signal processing unit 5080 may have a function of executing an analog-to-digital (AD) conversion processing on the signal output from the solid-state imaging device 201. In this case, the solid-state imaging device 201 does not necessarily have to include an AD conversion circuit internally.

The imaging system 500 further includes a buffer memory unit 510 for temporarily storing image data and an external interface (I/F) unit 512 for communicating with an external computer. The imaging system 500 further includes a storage medium 514 such as a semiconductor memory which imaging data is written into or read from, and a storage medium control interface (I/F) unit 516 which allows imaging data to be written into or read from the storage medium 514. The recording medium 514 may be built into or detachably attached to the imaging system 500.

The imaging system 500 further includes a general control/calculation unit 518 which executes various kinds of calculation and controls the entire digital still camera and a timing generation unit 520 which outputs various timing signals to the solid-state imaging device 201 and the signal processing unit 5080. Herein, the timing signal may be externally input thereto, and the imaging system 500 may include at least the solid-state imaging device 201 and the signal processing unit 5080 for processing the signal output from the solid-state imaging device 201. The general control/calculation unit 518 and the timing generation unit 520 may execute all or a part of the control function of the solid-state imaging device 201.

The solid-state imaging device 201 outputs an image signal to the signal processing unit 5080. The signal processing unit 5080 executes predetermined signal processing on the image signal output from the solid-state imaging device 201 and outputs the image data. Further, the signal processing unit 5080 generates an image by using the image signal.

With the imaging system configured of the solid-state imaging device 201 which is used as any one of the imaging devices of the above-described exemplary embodiments, an imaging system capable of acquiring images of better quality can be realized.

Figure 13A:
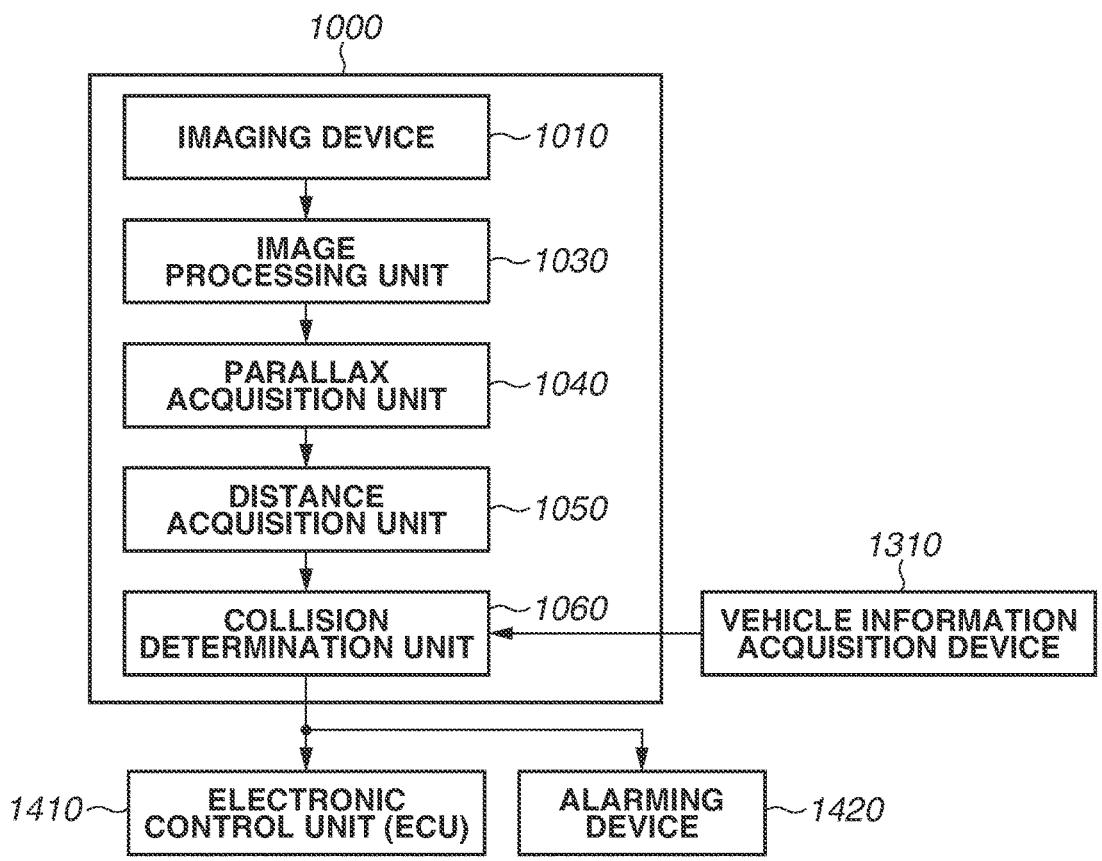
FIGS. 13A and 13B are diagrams illustrating a configuration of a moving body.
Figure 13B:
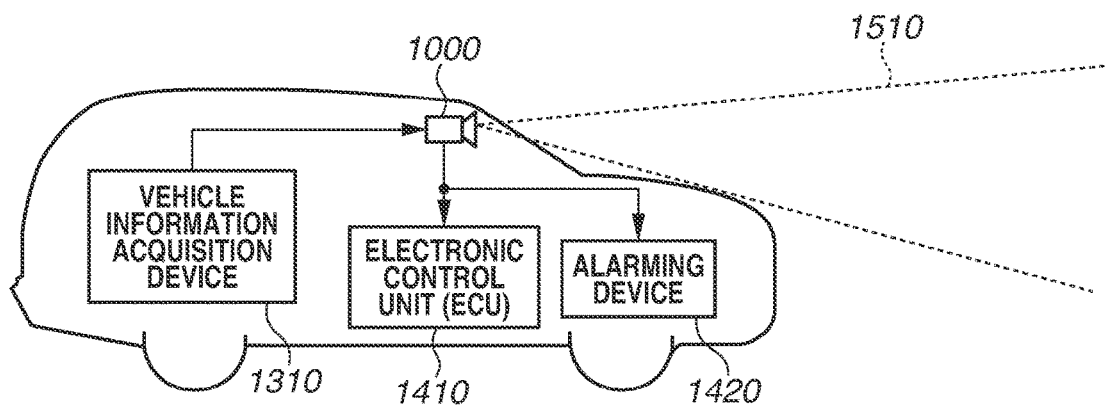

FIGS. 13A and 13B are respective diagrams illustrating the configurations of an imaging system 1000 and a moving body of a sixth exemplary embodiment. FIG. 13A is a diagram illustrating an example of the imaging system 1000 relating to an in-vehicle camera. The imaging system 1000 includes an imaging device 1010. The imaging device 1010 is the imaging device described in any one of the above-described exemplary embodiments. The imaging system 1000 includes an image processing unit 1030 for executing image processing on a plurality of pieces of image data acquired by the imaging device 1010 and a parallax acquisition unit 1040 for calculating parallax (a phase difference of a parallax image) of a plurality of pieces of image data acquired by the imaging system 1000. The imaging system 1000 further includes a distance acquisition unit 1050 for calculating a distance to a target object based on the calculated parallax and a collision determination unit 1060 for determining possibility of collision based on the calculated distance. Herein, the parallax acquisition unit 1040 or the distance acquisition unit 1050 is an example of a distance information acquisition unit that acquires information about a distance to a target object. In other words, distance information refers to pieces of information about parallax, a defocus amount, and a distance to a target object. The collision determination unit 1060 may determine a possibility of collision by using any one of these pieces of distance information. The distance information acquisition unit may be realized by exclusively-designed hardware, or may be realized by a software module. Further, the distance information acquisition unit may be realized by a field programmable gate array (FPGA) or an application specific integrated circuit (ASIC), or may be realized by a combination of the FPGA and the ASIC.

The imaging system 1000 is connected to a vehicle information acquisition device 1310, so that vehicle information such as a vehicle speed, a yaw rate, or a rudder angle can be acquired therefrom. Further, an electronic control unit (ECU) 1410 serving as a control device, which outputs a control signal for generating a breaking force with respect to a vehicle based on the determination result of the collision determination unit 1060, is connected to the imaging system 1000. In other words, the ECU 1410 is an example of a moving body control unit that controls a moving body based on the distance information. Further, the imaging system 1000 is also connected to an alarming device 1420 which provides an alarm to a driver based on a determination result of the collision determination unit 1060. For example, if the collision determination unit 1106 determines that a possibility of collision is high, the ECU 1410 executes vehicle control of avoiding a collision or reducing damages by applying a brake, releasing a gas pedal, or suppressing an engine output. The alarming device 1420 provides a warning to the user by ringing an alarm such as sound, displaying alarming information on a screen of a car navigation system, or producing vibrations in a seat belt or a steering wheel.

In the present exemplary embodiment, the imaging system 1000 captures peripheral images of a vehicle, e.g., a forward image and a backward image of a vehicle. FIG. 13B is a diagram illustrating a state where the imaging system 1000 captures a forward image (imaging range 1510) of the vehicle. The vehicle information acquisition device 1310 instructs the imaging system 1000 to operate and execute imaging. By using any one of the imaging devices of the above-described exemplary embodiments as the imaging device 1010, a distance measuring accuracy of the imaging system 1000 of the present exemplary embodiment can be further improved.

In the above-described exemplary embodiment, although control of preventing a vehicle from colliding with another vehicle has been described as an example, the present invention is also applicable to control of automatically driving a vehicle to follow another vehicle or control of automatically driving a vehicle not to drift from a traffic lane. Further, the imaging system is applicable not only to a vehicle such as an automobile but also to a moving body (moving apparatus) such as a ship, an airplane, or an industrial robot. Furthermore, the imaging system is applicable not only to a moving body but also to a device such as an intelligent transportation system (ITS), which widely employs an object recognition function.

<Variation Example>

The above-described exemplary embodiments are mere examples embodying the present invention, and shall not be construed as limiting the technical range of the present invention. In other words, the present invention can be realized in diverse ways without departing from a technical spirit or main features of the present invention. Further, the above-described exemplary embodiments can be combined in various ways.

According to the present invention, in the imaging device capable of concurrently reading signals of a plurality of pixels by using a plurality of vertical output lines, capacitive coupling caused by a parasitic capacitance between the first vertical output line and an input node of the amplification transistor of the second pixel is reduced. With this configuration, signal accuracy is prevented from being lowered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-103852, filed May 25, 2017, which is hereby incorporated by reference herein in its entirety.

What is claimed is:

1. An imaging device comprising:
   a plurality of pixels each including a photoelectric conversion unit and an amplification transistor having a gate and an output node, the gate being configured to receive a signal from the photoelectric conversion unit, the output node being configured to output a signal based on a potential of the gate;
   a first output line electrically connected to the output nodes of a first part of the plurality of pixels;
   a second output line electrically connected to the output nodes of a second part of the plurality of pixels, the second part being different from the first part of the plurality of pixels;
   a first wiring layer including a wiring connected to the output node, the first wiring layer being provided above an upper side of at least a part of the gate of the amplification transistor of the pixel connected to the first output line; and
   a second wiring layer including the second output line, the second wiring layer being provided above an upper side of the first wiring layer,
   wherein at least the part of the gate, the wiring, and the second output line overlap with each other in a planar view.

2. The imaging device according to claim 1,
   wherein each of the pixels further includes a transfer transistor connected to the photoelectric conversion unit and the gate,
   wherein the transfer transistor and the gate are connected to each other via a second wiring arranged at a height different from heights at which the gate of the transfer transistor and the gate of the amplification transistor are provided, and
   wherein the wiring and the second wiring are formed in a same wiring layer.

3. The imaging device according to claim 1,
   wherein each of the pixels further includes a transistor connected to the amplification transistor, and
   wherein the wiring is provided at a position between a control line and the gate of the amplification transistor, the control line being configured to transmit a signal for controlling the transistor.

4. The imaging device according to claim 3, wherein the transistor is a transfer transistor connected to the photoelectric conversion unit and the gate of the amplification transistor.

5. The imaging device according to claim 3, wherein the transistor is a reset transistor connected to the gate of the amplification transistor.

6. The imaging device according to claim 3, wherein the transistor is a selection transistor connected to the output node and the first output line.

7. The imaging device according to claim 1,
wherein each of the pixels includes a plurality of photoelectric conversion units arranged in correspondence with one microlens and a second amplification transistor having a second gate to which a signal of a first part of the plurality of photoelectric conversion units is input,
wherein a signal of a second part of the plurality of photoelectric conversion units is input to the gate of the amplification transistor, the second part of the plurality of photoelectric conversion units being different from the first part of the plurality of the photoelectric conversion units, and
wherein the imaging device further includes a third output line electrically connected to an output node of each of the second amplification transistors of the first part of the pixels, a fourth output line electrically connected to an output node of each of the second amplification transistors of the second part of the pixels different from the first part of the pixels, and a second wiring electrically connected to the output node, provided in an area, the area being positioned above an upper side of at least a part of the second gate, in a wiring layer, the wiring layer being positioned between the second gate of the pixel connected to the third output line and the fourth output line, the wiring layer being separated from the fourth output line by an insulation layer.

8. The imaging device according to claim 2,
wherein each of the pixels includes a plurality of photoelectric conversion units arranged in correspondence with one microlens and a second amplification transistor having a second gate to which a signal of a first part of the plurality of photoelectric conversion units is input,
wherein a signal of a second part of the plurality of photoelectric conversion units is input to the gate of the amplification transistor, the second part of the plurality of photoelectric conversion units being different from the first part of the plurality of the photoelectric conversion units, and
wherein the imaging device further includes a third output line electrically connected to an output node of each of the second amplification transistors of the first part of the pixels, a fourth output line electrically connected to an output node of each of the second amplification transistors of the second part of the pixels different from the first part of the pixels, and a second wiring electrically connected to the output node, provided in an area, the area being positioned above an upper side of at least a part of the second gate, in a wiring layer, the wiring layer being positioned between the second gate of the pixel connected to the third output line and the fourth output line, the wiring layer being separated from the fourth output line by an insulation layer.

9. The imaging device according to claim 3,
wherein each of the pixels includes a plurality of photoelectric conversion units arranged in correspondence with one microlens and a second amplification transistor having a second gate to which a signal of a first part of the plurality of photoelectric conversion units is input,
wherein a signal of a second part of the plurality of photoelectric conversion units is input to the gate of the amplification transistor, the second part of the plurality of photoelectric conversion units being different from the first part of the plurality of the photoelectric conversion units, and
wherein the imaging device further includes a third output line electrically connected to an output node of each of the second amplification transistors of the first part of the pixels, a fourth output line electrically connected to an output node of each of the second amplification transistors of the second part of the pixels different from the first part of the pixels, and a second wiring electrically connected to the output node, provided in an area, the area being positioned above an upper side of at least a part of the second gate, in a wiring layer, the wiring layer being positioned between the second gate of the pixel connected to the third output line and the fourth output line, the wiring layer being separated from the fourth output line by an insulation layer.

10. The imaging device according to claim 1,
wherein the photoelectric conversion unit is formed on a semiconductor substrate having a first face and a second face on an opposite side different from the first face,
wherein light enters the first face, and
wherein the gate of the amplification transistor is formed on a surface of the second face.

11. The imaging device according to claim 2,
wherein the photoelectric conversion unit is formed on a semiconductor substrate having a first face and a second face on an opposite side different from the first face,
wherein light enters the first face, and
wherein the gate of the amplification transistor is formed on a surface of the second face.

12. The imaging device according to claim 3,
wherein the photoelectric conversion unit is formed on a semiconductor substrate having a first face and a second face on an opposite side different from the first face,
wherein light enters the first face, and
wherein the gate of the amplification transistor is formed on a surface of the second face.

13. The imaging device according to claim 1, wherein the first part of the pixels and the second part of the pixels are arranged on a same column.

14. The imaging device according to claim 2, wherein the first part of the pixels and the second part of the pixels are arranged on a same column.

15. The imaging device according to claim 3, wherein the first part of the pixels and the second part of the pixels are pixels arranged on a same column.

16. The imaging device according to claim 13,
wherein color filters of a first color are provided on the first part of the pixels, and
wherein color filters of a second color different from the first color are provided on the second part of the pixels.

17. The imaging device according to claim 1, wherein the first part of the pixels and the second part of the pixels are provided on different columns.

18. An imaging system comprising:
the imaging device according to claim 1; and
a signal processing unit configured to generate an image by processing a signal output from the imaging device.

19. A moving body comprising:
the imaging device according to claim 1;
a distance information acquisition unit configured to acquire information about a distance to a target object from a parallax image based on a signal from the imaging device; and
a moving body control unit configured to control the moving body based on the distance information.

* * * * *